US006835990B2

(12) United States Patent
Iguchi et al.

(10) Patent No.: US 6,835,990 B2
(45) Date of Patent: Dec. 28, 2004

(54) SEMICONDUCTOR LIGHT RECEIVING ELEMENT

(75) Inventors: Yasuhiro Iguchi, Itami (JP); Akira Yamaguchi, Yokohama (JP); Manabu Shiozaki, Yokohama (JP); Takashi Iwasaki, Itami (JP); Kenji Ohki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 83 days.

(21) Appl. No.: 10/359,582

(22) Filed: Feb. 7, 2003

(65) Prior Publication Data

US 2003/0151057 A1 Aug. 14, 2003

(30) Foreign Application Priority Data

Feb. 8, 2002 (JP) ........................................ 2002-033081

(51) Int. Cl.[7] ......................................... H01L 31/0232
(52) U.S. Cl. ........................ 257/435; 257/432; 257/460
(58) Field of Search ............................... 257/432, 435, 257/458, 460

(56) References Cited

U.S. PATENT DOCUMENTS 5,747,861 A * 5/1998 Dentai ........................ 257/435
6,043,550 A * 3/2000 Kuhara et al. ............... 257/461
6,483,161 B1 * 11/2002 Kuhara et al. ............... 257/433
2003/0155625 A1 * 8/2003 Kato et al. ................... 257/432

OTHER PUBLICATIONS

"Novel Rear–Illuminated 1.55μ m–Photodiode with High Wavelength Selectivity Designed for Bi–Directional Optical Transceiver" Y. Iguchi, et al. 2000 International Conference on Indium Phosphide and Related Materials (May 14–18, 2000) pp. 317–320.

* cited by examiner

Primary Examiner—Bradley Baumeister
(74) Attorney, Agent, or Firm—McDermott Will & Emery LLP

(57) ABSTRACT

A semiconductor light receiving element has a semiconductor portion. The semiconductor portion includes a substrate, a light detecting portion, and a filter portion. The substrate, the light detecting portion, and the filter portion are provided sequentially in a direction of a predetermined axis. The light detecting portion has a light absorbing layer including a III-V semiconductor layer, a window layer including a III-V semiconductor layer, and an anode semiconductor region. The light absorbing layer is an n or i conductivity type semiconductor layer. The light absorbing layer is provided between a III-V semiconductor layer and the window layer. The light detecting portion is provided on one face of the semiconductor substrate with the III-V semiconductor layer interposed therebetween. The filter portion includes InGaAsP semiconductor layers and III-V semiconductor layers.

19 Claims, 13 Drawing Sheets

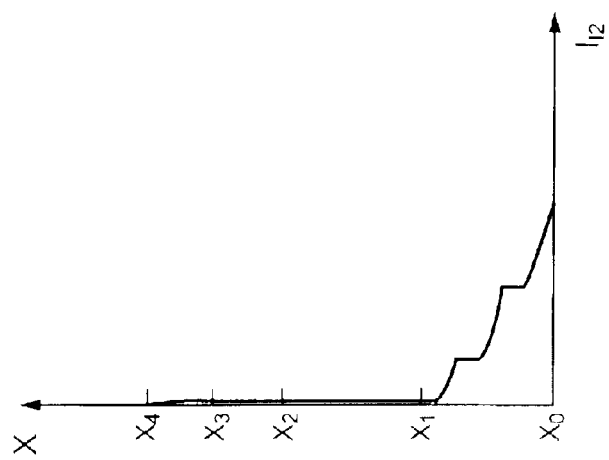
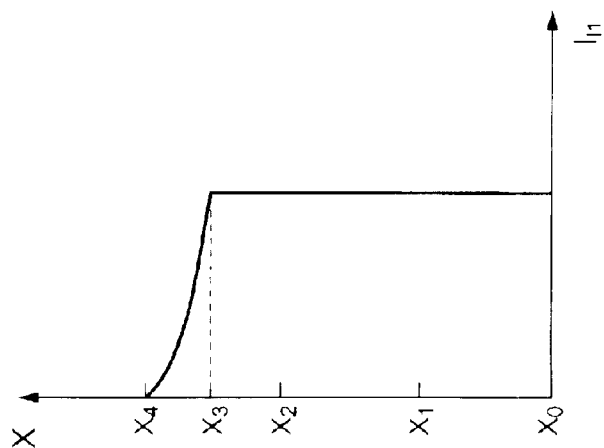
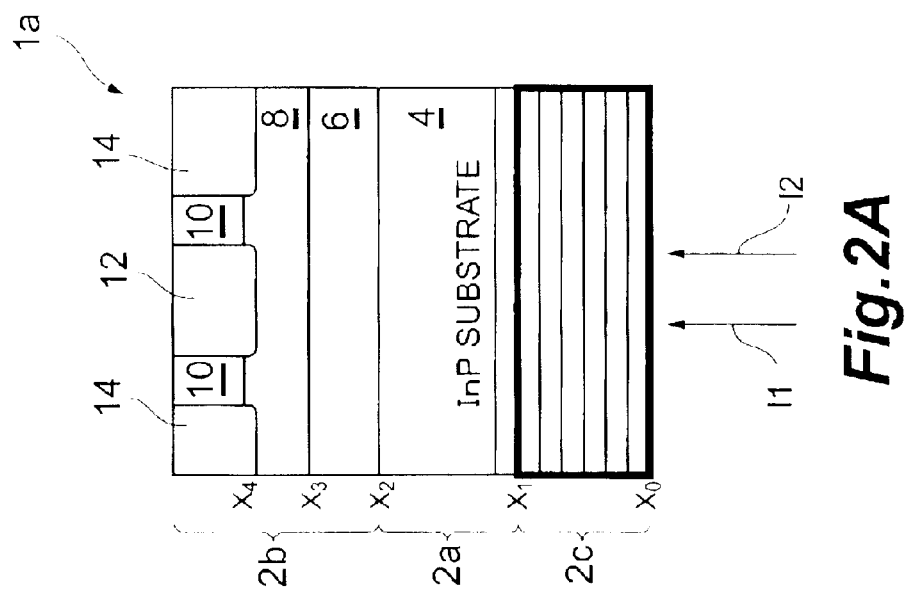

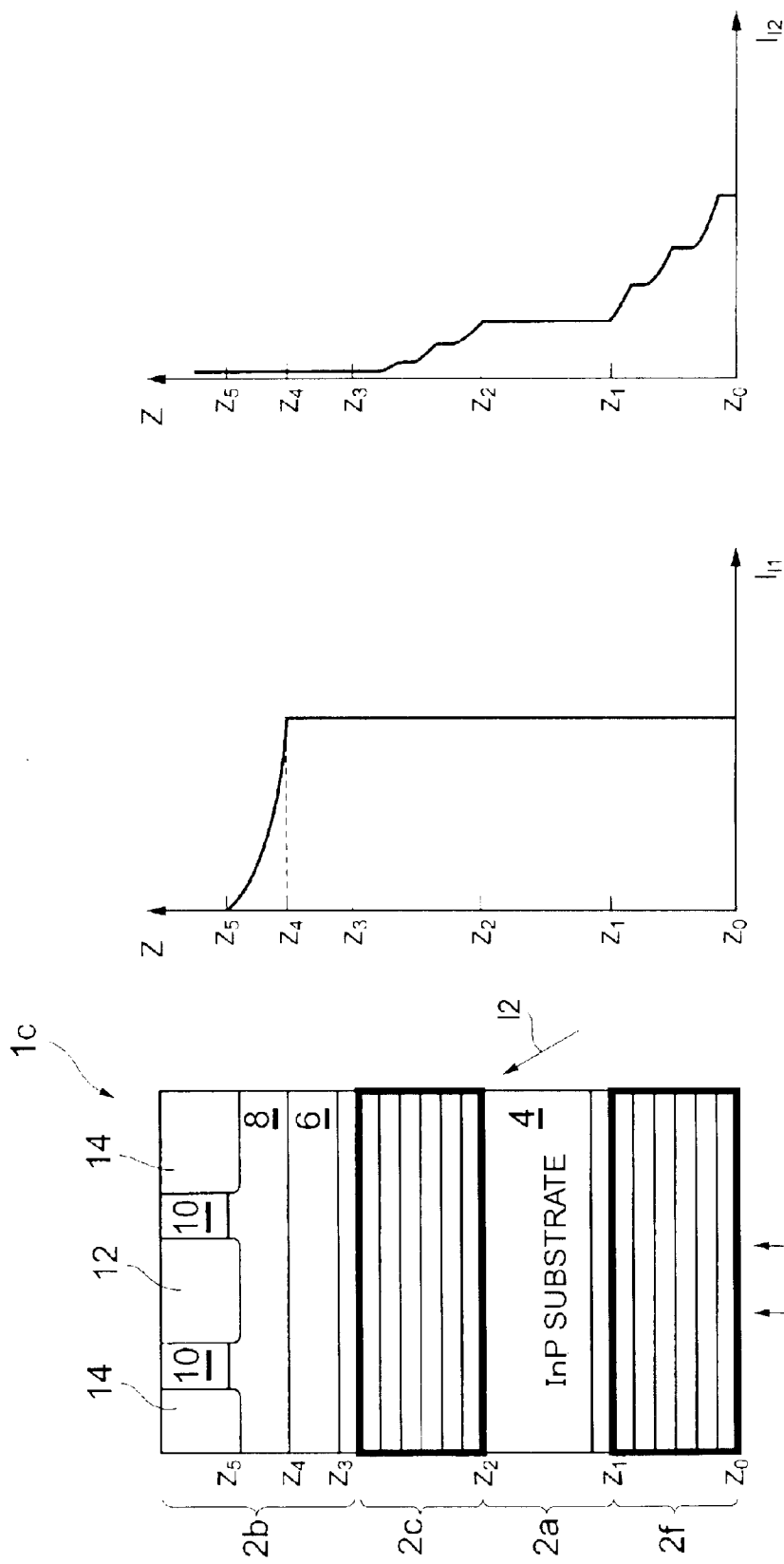

Fig.6

| CONDITION | C1 | C2 |
|---|---|---|
| InP | 2.000 $\mu$m | 2.000 $\mu$m |
| InGaAsP | 1.142 | 1.460 |
| InP | 0.500 | 0.103 |
| InGaAsP | 1.335 | 0.667 |
| InP | 0.500 | 0.200 |
| InGaAsP | 1.365 | 1.500 |
| InP | 0.500 | 0.200 |
| InGaAsP | 1.158 | 1.373 |
| Rmax(dB) | -17.4 | -16.0 |

Fig.7

| CONDITION | C0 | C3 | C4 | C5 | C6 |
|---|---|---|---|---|---|
| InP | 2.000μm | 2.000μm | 2.000μm | 2.000μm | 2.000μm |
| InGaAsP | 1.000 | 0.670 | 1.189 | 0.661 | 0.668 |
| InP | 0.500 | 0.500 | 0.100 | 0.200 | 0.188 |
| InGaAsP | 1.000 | 1.344 | 0.721 | 1.317 | 1.334 |
| InP | 0.500 | 0.500 | 0.100 | 0.200 | 0.188 |
| InGaAsP | 1.000 | 1.367 | 1.181 | 1.078 | 1.130 |
| InP | 0.500 | 0.500 | 0.100 | 0.200 | 0.114 |
| InGaAsP | 1.000 | 0.935 | 1.960 | 0.612 | 0.936 |
| InP | 0.500 | 0.500 | 0.100 | 0.200 | 0.102 |
| InGaAsP | 1.000 | 0.684 | 0.949 | 1.331 | 0.932 |
| Rmax(dB) | -9.7 | -18.4 | -19.7 | -18.2 | -21.1 |

SEMICONDUCTOR LIGHT RECEIVING ELEMENT

BACKGROUND OF THE INVENTION

1. Field of the Invention

The present invention relates to a semiconductor light receiving element.

2. Related Background of the Invention

In the field of optical communications, wavelength components of light in 1.3 μm and 1.55 μm bands are used as signal light. In a certain optical communication line, light of wavelength components in the 1.3 μm and 1.55 μm bands is transmitted in a single optical fiber.

SUMMARY OF THE INVENTION

In such an optical communication system, a light receiving element needs to selectively receive signal light having one component of these wavelength components. The light receiving element is required to block light of a wavelength component in the 1.3 μm band and to receive light of a wavelength component in the 1.55 μm band. In order to realize the wavelength selection, a single InGaAsP semiconductor layer is provided between a semiconductor substrate and a light absorbing layer. The InGaAsP semiconductor layer absorbs light of a wavelength component in the 1.3 μm band and transmits light of a wavelength component in the 1.55 μm band. In order to realize sufficient absorption of light in the 1.3 μm band, the thickness of the InGaAsP semiconductor layer is approximately several micrometers. The thickness of the single InGaAsP semiconductor layer having an absorption coefficient, $\alpha = 8500$ cm$^{-1}$, and an absorption edge of wavelength, $\lambda g = 1.44$ μm, is estimated to be approximately 5.5 μm.

There is miscibility gap in the phase diagram of InGaAsP semiconductor. The phase separation is apt to occur when a thick InGaAsP semiconductor film is grown. According to the above estimation, however, the film thickness of several micrometers is required for obtaining sufficient filter characteristics. In order to obtain a film of such a thickness, an InGaAsP semiconductor film is grown under strict control of film growth conditions.

Although it is difficult to grow an InGaAsP semiconductor film having a thickness that realizes desired filter characteristics, the realization of desired filter characteristics is required for a semiconductor light receiving element having an InGaAsP semiconductor film.

Accordingly, it is an object of the present invention to provide a semiconductor light receiving element having a structure capable of realizing desired filter characteristics.

One aspect of the present invention relates to a semiconductor light receiving element. The semiconductor light receiving element comprises a light incident face, a light detecting portion, and a first filter portion. The light detecting portion has a light absorbing layer containing III-V semiconductor. The first filter portion is provided between the light incident face and the light detecting portion. The first filter portion has a plurality of III-V semiconductor layers and a plurality of InGaAsP semiconductor layers. The III-V semiconductor layers and the InGaAsP semiconductor layers are arranged alternately.

Since the first filter portion includes the plurality of InGaAsP semiconductor layers, desired filter characteristics can be realized by the total thickness of these semiconductor layers.

The semiconductor light receiving element may further comprise a substrate provided between the light incident face and the light detecting portion. Incident light can be transmitted through the substrate. Thus, a back illuminated type semiconductor light receiving element is provided.

There are a number of embodiments of the semiconductor light receiving element as follows. In one embodiment, the first filter portion may be provided between the light detecting portion and the substrate. The first filter portion can also block noise light entering from a side face of the substrate. In another embodiment, the first filter portion may be provided between the substrate and the light incident face. The substrate is provided between the first filter portion and the light detecting portion, thus lowering the possibility that electron-hole pairs generated in the first filter portion reach the light detecting portion. In still another embodiment, the semiconductor light receiving element may further comprises a second filter portion. The second filter portion has a plurality of III-V semiconductor layers and a plurality of InGaAsP semiconductor layers. The plurality of III-V semiconductor layers and the plurality of InGaAsP semiconductor layers are arranged alternately in a direction of a predetermined axis. The substrate is provided between the first and second filter portions.

In the semiconductor light receiving element, a thickness of each InGaAsP semiconductor layer is preferably 1.5 μm or less. Each InGaAsP semiconductor layer has s reduced thickness, thus making it possible to reduce the occurrence of phase separation.

In the semiconductor light receiving element, the number of InGaAsP semiconductor layers is preferably five or more, thereby making the desired filter characteristics easy to obtain.

In the semiconductor light receiving element, each III-V semiconductor layer in the first filter portion may include an InP semiconductor layer. Preferably, the thickness values of the respective InGaAsP semiconductor layers differ from each other, whereby the first filter portion does not exhibit any periodicity coming from the arrangement of these InGaAsP semiconductor layers.

In the semiconductor light receiving element, each III-V semiconductor layer in the first filter portion preferably includes an InP semiconductor layer. The thickness values of the InP semiconductor layers are smaller than those of the InGaAsP semiconductor layers.

In the semiconductor light receiving element, each III-V semiconductor layer in the first filter portion may include an InP semiconductor layer. The InP semiconductor layers and the InGaAsP semiconductor layers in the first filter portion have their respective thickness values so that the first filter portion has a light transmission window in a wavelength range from 1.45 μm to 1.65 μm inclusive.

The semiconductor light receiving element may further comprise an InP window layer. The detecting portion is provided between the InP window layer and the substrate.

The light detecting portion includes a semiconductor region having a conductivity type different from that of the light absorbing layer. This semiconductor region and the light absorbing layer are provided to constitute a junction.

The above object and other objects, features, and advantages of the present invention will become more easily apparent from the following detailed description of a preferred embodiment of the present invention which proceeds with reference to the accompanying drawings.

BRIEF DESCRIPTION OF THE DRAWINGS

FIG. 2A is a view showing a structure of a semiconductor light receiving element of the first embodiment.

FIGS. 2B and 2C are characteristic diagrams of this semiconductor light receiving element;

FIG. 4A is a view showing a structure of a semiconductor light receiving element of still another embodiment;

FIGS. 4B and 4C are characteristic diagrams of this semiconductor light receiving element;

FIG. 6 is a view showing conditions for numerical experiments;

FIG. 7 is a view showing conditions for other numerical experiments;

DESCRIPTION OF THE PREFERRED EMBODIMENTS

Figure 1:
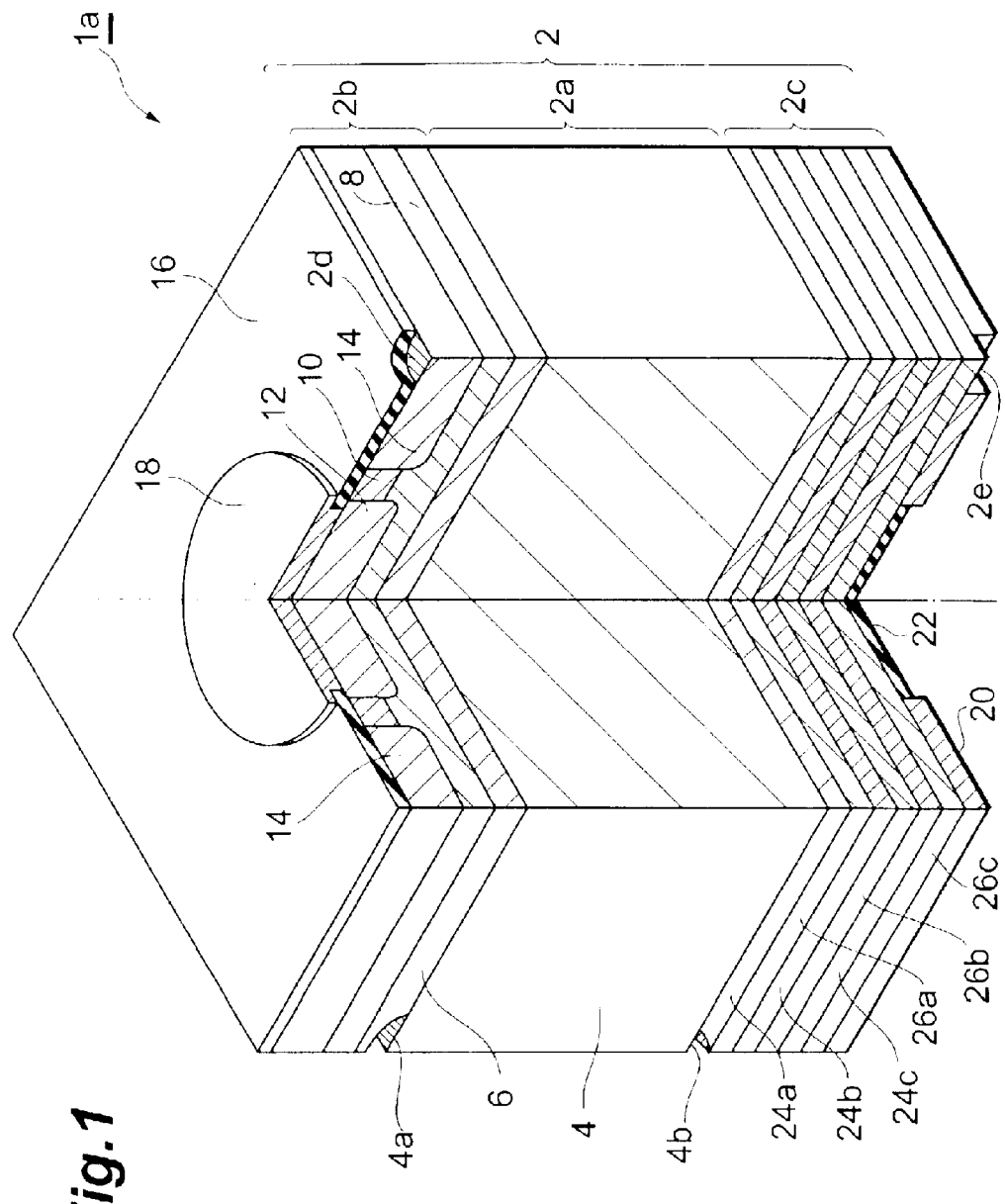
FIG. 1 is a perspective view of a semiconductor light receiving element of an embodiment.

The present invention will be easily understood by considering the following detailed description together with the accompanying drawings. In order to show same components common to the drawings, same reference numerals are used when possible.

(First Embodiment)

FIG. 1 is a perspective view of a semiconductor light receiving element according to the present embodiment. The semiconductor light receiving element 1a has a semiconductor portion 2, and the semiconductor portion 2 includes a substrate 2a, a light detecting portion 2b, and a filter portion 2c. The substrate 2a, the light detecting portion 2b, and the filter portion 2c are arranged sequentially in a direction of a predetermined axis. The semiconductor portion 2 has a pair of faces 2d and 2e intersecting the predetermined axis.

The substrate 2a has a semiconductor substrate 4, such as $n^+$-InP semiconductor substrate. The semiconductor substrate 4 has a pair of faces 4a and 4b. A III-V semiconductor layer 6, such as a $n^-$-InP layer, can be provided on one face 4a. The light detecting portion 2b is provided on the one face 4a, and the III-V semiconductor layer 6 is provided between the semiconductor substrate 4 and the light detecting portion 2b.

The light detecting portion 2b has a light absorbing layer 8 including a III-V semiconductor layer, a window layer 10 including a III-V semiconductor layer, and a p-type semiconductor region 12. The light absorbing layer 8 may be a semiconductor layer of n conductivity type or i conductivity type. A band gap of the light absorbing layer 8 is smaller than that of the semiconductor substrate 4, and the light absorbing layer 8 absorbs transmitted light from the semiconductor substrate 4 and III-V semiconductor layer 6 to generate electron-hole pairs. The light absorbing layer 8 is provided between the III-V semiconductor layer 6 and window layer 10. As examples of material for the light absorbing layer 8, InGaAs semiconductor and InGaAsP semiconductor are shown.

The p-type semiconductor region 12 is made of III-V semiconductor doped with dopant. The p-type semiconductor region 12 extends in the window layer 10 in a direction of the predetermined axis from one face 2d of the semiconductor portion 2 to the light absorbing layer 8 so that the p-type semiconductor region 12 and the light absorbing layer 8 form a junction therebetween. The window layer 10 is provided so as to cover the junction between the light absorbing layer 8 and the p-type semiconductor region 12. The covering can protect the junction relating to the generation of electron-hole pairs.

A carrier absorbing semiconductor region 14 is provided around the p-type semiconductor region 12. In FIG. 1, the carrier absorbing semiconductor region 14 surrounds the p-type semiconductor region 12. The carrier absorbing semiconductor region 14 serves to efficiently absorb noise carriers. In the embodiment as shown in FIG. 1, for example, the carrier absorbing semiconductor region 14 extends in the window layer 10 in a direction of the predetermined axis from the one face 2d of the semiconductor portion 2 to the light absorbing layer 8 so that the carrier absorbing semiconductor region 14 and the light absorbing layer 8 form a junction therebetween.

An insulation film 16, such as an insulating silicon compound film, is provided on the one face 2d of the semiconductor portion 2. The insulation film 16 serves as a passivation film. The insulation film 16 has an opening provided on the p-type semiconductor region 12. An anode electrode 18 is provided so as to cover the opening.

A cathode electrode 20 is provided on the other face 2e of the semiconductor portion 2. The cathode electrode 20 has an opening. The opening is provided with an anti-reflective film 22. In the present embodiment, the opening is positioned so that light transmitted through the opening can reach the p-type semiconductor region 12, for example.

The filter portion 2c includes InGaAsP semiconductor layers 24a, 24b and 24c and III-V semiconductor layers 26a, 26b and 26c. The total thickness of the InGaAsP semiconductor layers 24a, 24b and 24c is determined such that the filter portion 2c provides desired light absorption. The III-V semiconductor of the layers 26a, 26b and 26c has its band gap larger than that of the InGaAsP semiconductor of the layers 24a, 24b and 24c. The InGaAsP semiconductor layers 24a, 24b and 24c and the III-V semiconductor layers 26a, 26b and 26c are alternately arranged. The thickness values of the respective InGaAsP semiconductor layers 24a, 24b and 24c differ from each other. By use of these InGaAsP semiconductor layers 24a, 24b and 24c, the filter portion 2c does not have any periodicity coming from these InGaAsP semiconductor layers. The filter portion 2c is constituted so as not to exhibit light interference due to the periodic arrangement of the semiconductor layers. In the filter portion 2c, light reflection occurs at boundaries between any two adjacent layers of the semiconductor layers 24a, 24b, 24c, 26a, 26b and 26c. The thickness values of the respective semiconductor layers 24a, 24b, 24c, 26a, 26b and 26c are determined so that the reflection spectrum from the light reflection exhibit a light transmission window in a wavelength range from 1.45 μm to 1.65 μm inclusive. In the light transmission window, the loss of transmitted light is preferably 0.1 dB or less.

In the semiconductor light receiving element, the thickness values of the InP semiconductor layers and the InGaAsP semiconductor layers in the filter portion are determined so that the filter portion can sufficiently absorb light in a wavelength range from 1.25 micrometers to 1.32 micrometers inclusive. The crystal composition of the InGaAsP semiconductor layers is determined so as to transmit light having a wavelength from 1.45 micrometers to 1.65 micrometers inclusive.

A structure of the semiconductor light receiving element is, for example, as follows. Substrate 4: n$^+$-InP substrate III-V semiconductor layer 6: n$^-$-InP semiconductor layer Light absorbing layer 8:

n or i-type InGaAs semiconductor layer Window layer 10: n-type InP semiconductor layer InGaAsP semiconductor layers 24a, 24b and 24c:

n-type $In_{0.6525}Ga_{0.3474}As_{0.7806}P_{0.2194}$ semiconductor layer Semiconductor layers 26a, 26b and 26c:

n-type InP semiconductor layer

These semiconductor layers can be formed by organometallic vapor phase epitaxy (OMVPE), liquid phase epitaxy (LPE), or vapor phase epitaxy (VPE), for example.

FIG. 2A is a schematic diagram for explaining the operation of the semiconductor light receiving element. In the semiconductor light receiving element 1a, light of wavelength components $\lambda_1$ and $\lambda_2$ is incident on the back face thereof. Examples of these wavelengths are as follows: $\lambda_1$=1.55 μm and $\lambda_2$=1.30 μm. FIG. 2B is a view showing an intensity variation of the light of the wavelength $\lambda_1$ which has entered into the semiconductor light receiving element 1a. FIG. 2C is a view showing an intensity variation of the light of the wavelength $\lambda_2$ which has entered into the semiconductor light receiving element 1a. The light of the wavelength component $\lambda_1$ is transmitted through the filter portion 2c and the semiconductor substrate 2a to reach the light absorbing layer 8. In the light absorbing layer 8, the light intensity of the wavelength component $\lambda_1$ is decreased as the light generates electron-hole pairs. The light of the wavelength component $\lambda_2$ is transmitted through the InP semiconductor layers of the filter portion 2c, and the light intensity is attenuated as the light is absorbed in the InGaAsP semiconductor layers of the filter portion 2c. The light intensity of the wavelength component $\lambda_2$ becomes sufficiently small in the substrate 2a and the light detecting portion 2b. Accordingly, although the InGaAs semiconductor layer of the light detecting portion 2b has sensitivity to light of wavelength components in both 1.55 μm and 1.30 μm bands, only light components in the 1.55 μm band enters into the light detecting portion 2b and is detected in the light detecting portion 2b.

(Second Embodiment)

Figure 3A:
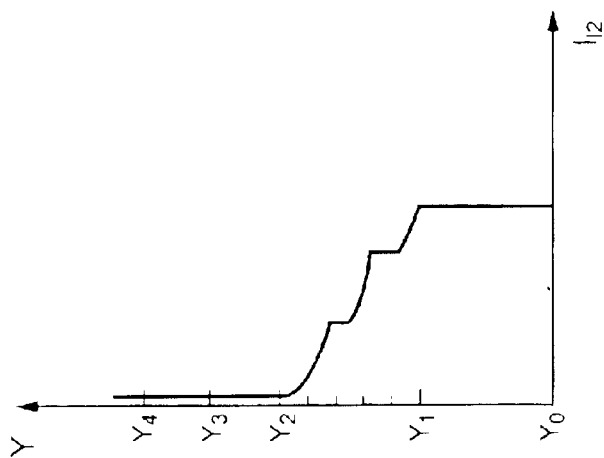
FIG. 3A is a view showing a structure of a semiconductor light receiving element of another embodiment.
Figure 3B:
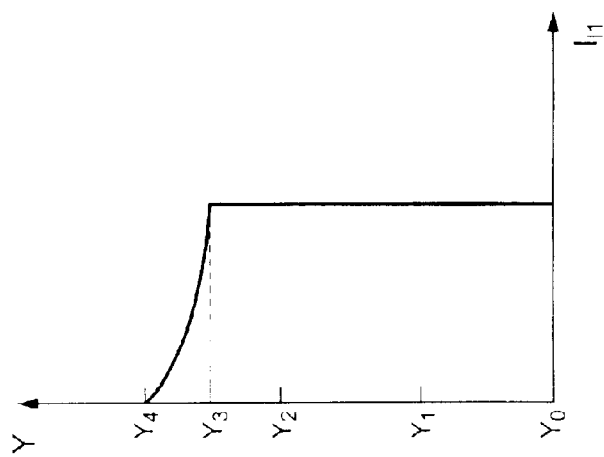
FIGS. 3B and 3C are characteristic diagrams of this semiconductor light receiving element.
Figure 3C:
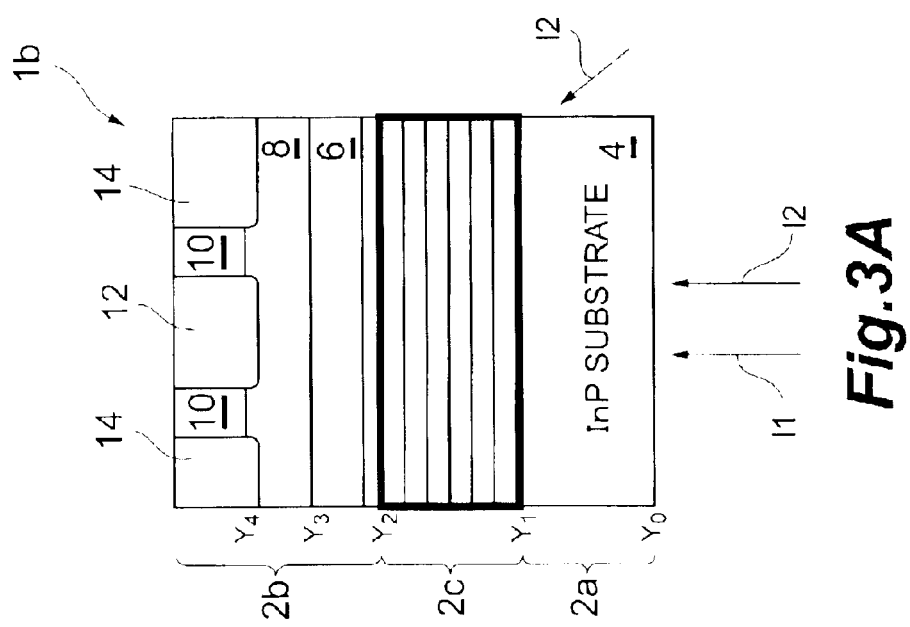

Referring to FIGS. 3A to 3C, a semiconductor light receiving element 1b of another embodiment will be described. In the semiconductor light receiving element 1b, the filter portion 2c is provided between the light detecting portion 2b and the substrate 2a.

FIG. 3A is a schematic diagram for explaining the operation of the semiconductor light receiving element. In the semiconductor light receiving element 1b, light of wavelength components $\lambda_1$ and $\lambda_2$ is incident on the back face thereof as is the case with FIG. 2A. In the semiconductor light receiving element 1b, the filter portion 2c can also absorb noise light of the wavelength $\lambda_2$ from a side face of the substrate 2a. FIG. 3B is a view showing an intensity variation of the light of the wavelength $\lambda_1$ which has entered into the semiconductor light receiving element 1b. FIG. 3C is a view showing an intensity variation of the light of the wavelength $\lambda_2$ which has entered into the semiconductor light receiving element 1b. The light of the wavelength component $\lambda_1$ is transmitted through the filter portion 2c and the semiconductor substrate 2a to the light absorbing layer 8 as is the case with FIG. 2B. In the light absorbing layer 8, the intensity of light of the wavelength component $\lambda_1$ is decreased as the light generates electron-hole pairs. The light of the wavelength component $\lambda_2$ is transmitted through the semiconductor substrate 2a and InP semiconductor layers of the filter portion 2c, and the intensity of the light is attenuated as the light is absorbed by InGaAsP semiconductor layers of the filter portion. The light intensity of the wavelength component $\lambda_2$ becomes sufficiently small in the light detecting portion 2b.

(Third Embodiment)

Referring to FIGS. 4A to 4C, a semiconductor light receiving element 1c of still another embodiment will be described. The semiconductor light receiving element 1c has the filter portion 2c between the light detecting portion 2b and the substrate 2a, and also has a filter portion 2f between the substrate 2a and a light incident face. The filter portion 2f includes a plurality of InGaAsP semiconductor layers and a plurality of III-V semiconductor layers, and these semiconductor layers are alternately provided. The structure of the filter portion 2f may be similar to that of the filter portion 2c, but is not limited thereto.

FIG. 4A is a schematic diagram for explaining operation of the semiconductor light receiving element. In the semiconductor light receiving element 1c, light of wavelength components $\lambda_1$ and $\lambda_2$ is incident on the back face thereof as in the case of FIG. 2A. In the semiconductor light receiving element 1c, noise light of the wavelength $\lambda_2$ from a side face of the substrate 2a is also absorbed by the filter portion 2c as is the case with FIG. 3A. FIG. 4B is a view showing an intensity variation of the light of the wavelength $\lambda_1$ which has entered into the semiconductor light receiving element 1c. FIG. 4C is a view showing an intensity variation of the light of the wavelength $\lambda_2$ which has entered into the semiconductor light receiving element 1c. The light of the wavelength component $\lambda_1$ is transmitted through the filter portions 2f and 2c and the semiconductor substrate 2a to reach a light absorbing layer 8 as in the case of FIG. 2B. The intensity of light of the wavelength component $\lambda_1$ is attenuated in the light absorbing layer 8 as the light generates electron-hole pairs. The light of the wavelength component $\lambda_2$ is transmitted through InP semiconductor layers of the filter portion 2f, and is attenuated in the InGaAsP semiconductor layers of the filter portion 2f as it is absorbed thereby. Then, the light including the attenuated wavelength component $\lambda_2$ passes through the semiconductor substrate 2a, transmits through InP semiconductor layers of the filter portion 2c and decreases in the InGaAsP semiconductor layers of the filter portion 2c as it is absorbed thereby. The light intensity of the wavelength component $\lambda_2$ becomes sufficiently small in the light detecting portion 2b. In the semiconductor light receiving element 1c, the total thickness of the InGaAsP semiconductor layers in the filter portions 2c and 2f may be equal to that of the InGaAsP semiconductor layers in the filter portion 2c of the semiconductor light receiving element 1b, but for example, may be more preferably thicker than that of the semiconductor light receiving element 1b.

In the semiconductor light receiving elements 1a, 1b, and 1c, each InP semiconductor layer exerts an interface interaction, such as a stress, on the InGaAs semiconductor layer adjacent thereto. This interface interaction is weakens as the thickness of the InGaAs semiconductor layer is increased. Since the InGaAs semiconductor layer is sandwiched between the InP semiconductor layers on both sides thereof, the InGaAs semiconductor layer exhibits desired characteristics. Preferably, each of these InP semiconductor layers has a thickness such that the interface interaction sufficiently works.

Moreover, in the semiconductor light receiving elements 1a, 1b, and 1c, the light absorbing layer is apart from the filter portion at a sufficient distance. The III-V semiconductor layer, such as an InP semiconductor layer, is provided between the filter portion and the light absorbing layer. The thickness of the III-V semiconductor layer is preferably determined so that the number of excited electrons becomes sufficiently small. Accordingly, although light is absorbed in the InGaAsP semiconductor layer of the filter portion to excite electrons, most of these electrons return to the original energy level through non-radiative recombination centers or the like.

(Fourth Embodiment)

Figure 5A:
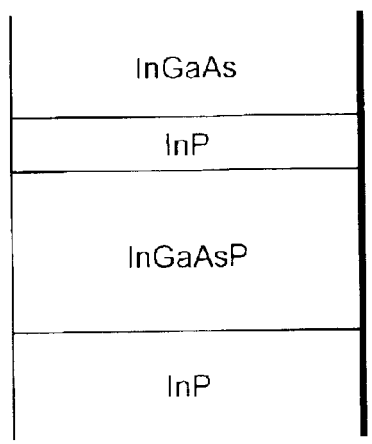
FIGS. 5A to 5C are views showing models for numerical experiments.
Figure 5B:
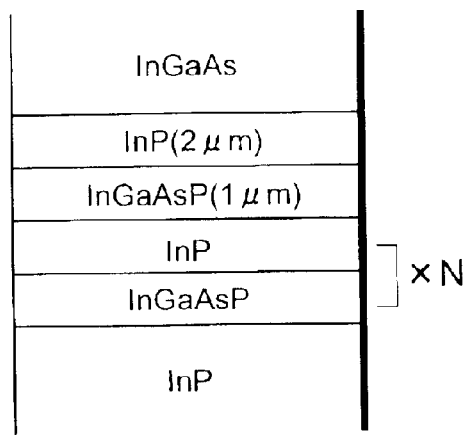
Figure 5C:
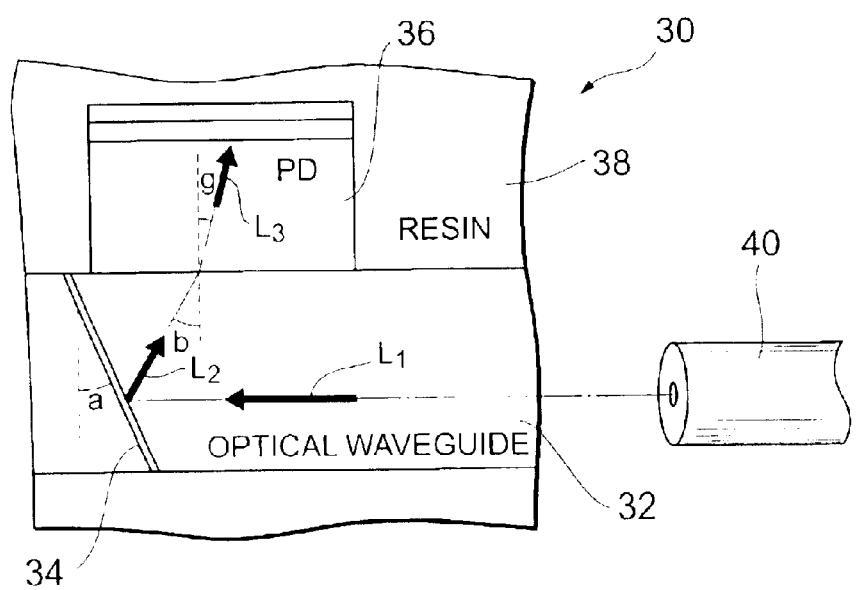

The semiconductor light receiving elements according to the embodiments will be studied below in more detail. FIGS. 5A to 5C show models for numerical experiments. FIG. 6 shows conditions used in the numerical experiments. FIG. 7 shows conditions used in other numerical experiments.

FIG. 5A shows a structure of a light receiving element. FIG. 5B show a structure of a light receiving element, and this structure can be obtained by generalizing the structure of the light receiving element shown in the second embodiment. The symbol N shown in the drawing indicates the number of pairs each of which is composed of a InP semiconductor layer and an InGaAsP semiconductor layer in a filter portion. FIG. 5C shows a structure of an optical module used in the numerical experiments. The optical module 30 has a passive alignment structure. Referring to FIG. 5C, the optical module 30 has a structure capable of entering light passing through a filter element 34 into a light receiving element 36. The filter element 34 is provided so as to intersect a predetermined axis in a direction of which an optical waveguide 32 extends. The optical waveguide 32, the filter element 34, and the light receiving element 36 are provided in a resin 38 through which light propagating in the optical waveguide 32 can be transmitted. The optical waveguide 32 receives light $L_1$ from an optical fiber 40. The light $L_1$ is filtered by the filter element 34 to become light $L_2$ of a selected wavelength directed toward a light incident face of the light receiving element 36. The light $L_2$ enters into the light receiving element 36 through the light incident face to become light $L_3$, and the light $L_3$ is detected by a light detecting portion. Note that $\alpha=\beta=30$ degrees and $\gamma=14.2$ degrees in these experiments. The refractive index of the resin 38 is 1.52.

Four InGaAsP semiconductor layers ($\lambda g=1.44$ $\mu m$, approximate thickness 1 $\mu m$) and four InP semiconductor layers (approximate thickness 0.5 $\mu m$) are laminated to constitute a filter portion. Optical measurement of the filter portion is conducted. An InGaAsP semiconductor film having such a thickness can be stably grown by MOCVD.

The filter portion composed of four InGaAsP semiconductor layers ($\lambda g=1.44$ $\mu m$, thickness 1 $\mu m$) and four InP semiconductor layers (thickness 0.5 $\mu m$) is modeled as follows:

In $Ga_X In_{1-X} As_Y P_{1-Y}$ semiconductor,
InP: X=0, Y=0;
Eg=$2.13 \times 10^{-19}$ J (1.334 eV);
$\lambda g=0.922$ $\mu m$; n=3.100
InGaAsP: X=0.353, Y=0.752;
Eg=$1.39 \times 10^{-19}$ J (0.867 eV);
$\lambda g=1.430$ $\mu m$; n=3.446
InGaAs: X=0.470, Y=1.000;
Eg=$1.19 \times 10^{-19}$ J (0.744 eV);
$\lambda g=1.666$ $\mu m$; n=3.560
and numerical experiments are conducted using this model.

Comparing the results of the measurement and numerical experiment with each other, transmittance in the 1.3 μm band shows good consistency, and reflection loss in the 1.55 μm band also shows good consistency. Therefore, this modeling manner is sufficiently reliable. Moreover, it has become clear that desired filter characteristics can be implemented by the thickness of InGaAsP semiconductor achieved by a plurality of InGaAsP semiconductor films as well.

Referring to FIG. 6, examples of filter portions with N=4 are shown. Referring to FIG. 7, examples of filter portions with N=5 are shown. Numerical experiments under these conditions are conducted using simulated annealing method so that the maximum reflectance is minimized in a wavelength range from 1.45 μm to 1.65 μm inclusive.

In the conditions C1 to C6 of FIGS. 6 and 7, the following constraints are added: a thickness of an InGaAsP semiconductor layer of a filter portion can be changed in a range from 0.5 μm to 1.5 μm inclusive; the total thickness of InGaAsP semiconductor layers is 5 μm.

In the condition C1, the thickness of each InP semiconductor layer is 0.5 μm, and the thicknesses of InGaAsP semiconductor layers are varied. The maximum reflectance is minimized in the above-described wavelength region to be −17.4 dB.

Figure 8A:
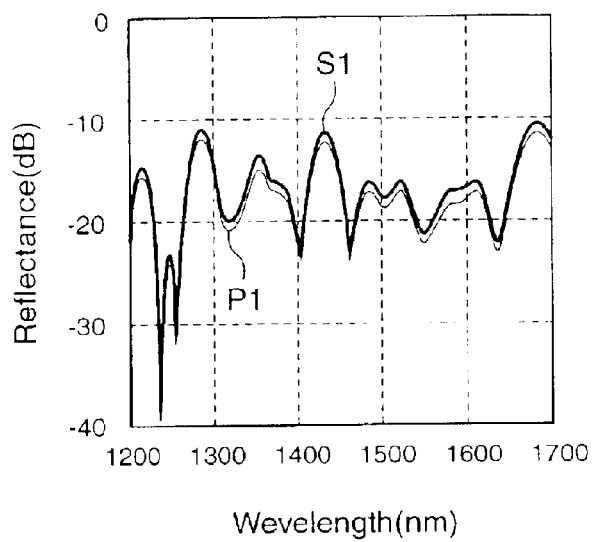
FIGS. 8A to 8C are a characteristic diagram showing reflectivity of a filter portion under condition C2, a characteristic diagram showing PDL of the relevant filter portion, and a characteristic diagram showing PDS of the relevant filter portion, respectively.
Figure 8B:
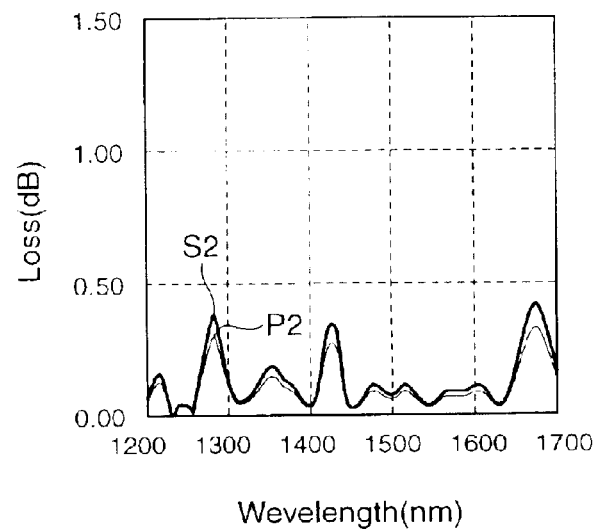
Figure 8C:
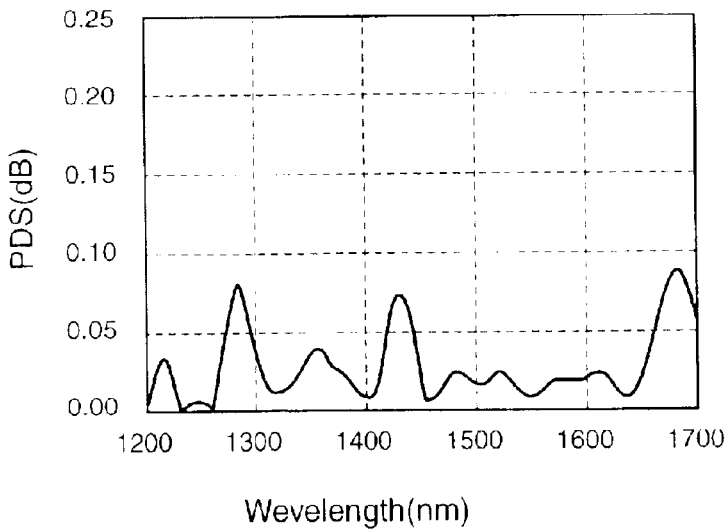

In the condition C2, the thicknesses of InP semiconductor layers can be varied in a range from 0.1 μm to 0.2 μm inclusive, and the thickness values of InGaAsP semiconductor layers are varied. FIGS. 8A to 8C show the reflectance of the filter portion under the condition C2, the polarization dependent loss (PDL) of the relevant filter portion, and the polarization dependent sensitivity (PDS) of the relevant filter portion, respectively. In FIGS. 8A to 8C, symbols S1 and S2 indicate curves of S wave components, respectively and symbols P1 and P2 indicate curves of P wave components, respectively. The maximum reflectance is minimized in the above-described wavelength region to be −16.0 dB.

In the condition C3, the thickness of each InP semiconductor layer is 0.5 μm, and the thicknesses of InGaAsP semiconductor layers are varied. The maximum reflectance is minimized in the above-described wavelength region to be −18.4 dB.

Figure 9A:
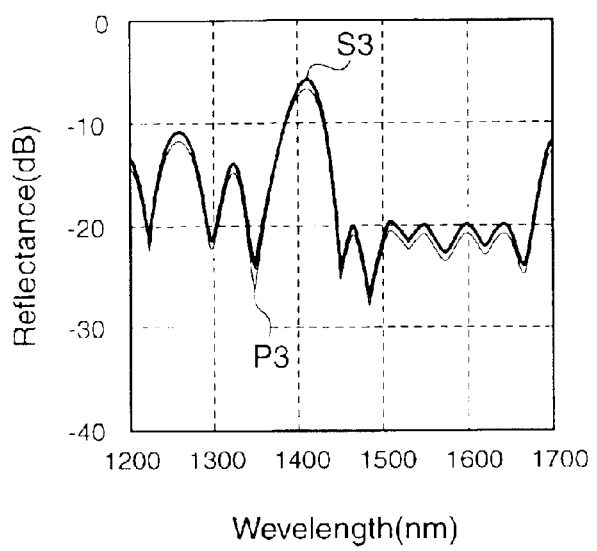
FIGS. 9A to 9C are a characteristic diagram showing reflectivity of a filter portion under condition C3, a characteristic diagram showing PDL of the relevant filter portion, and a characteristic diagram showing PDS of the relevant filter portion, respectively.
Figure 9B:
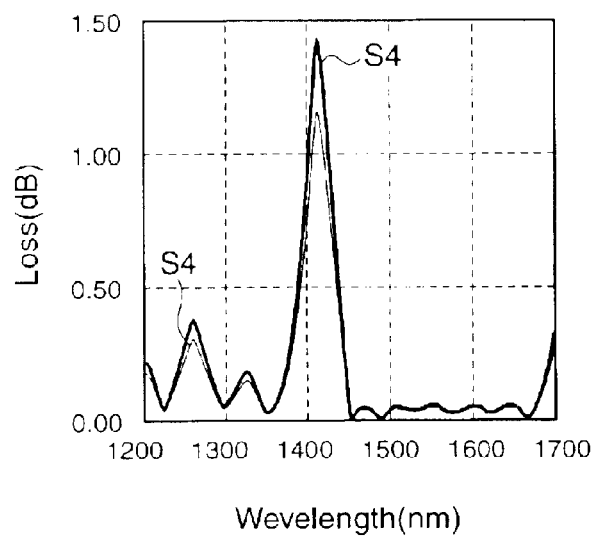
Figure 9C:
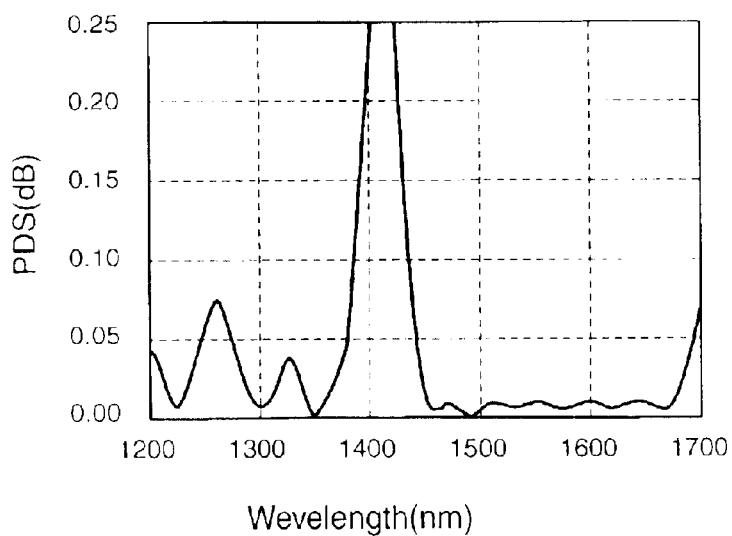

In the condition C4, the thickness of each InP semiconductor layer is 0.1 μm, and the thicknesses of InGaAsP semiconductor layers are varied. FIGS. 9A to 9C show the reflectance of the filter portion under the condition C4, the PDL of the relevant filter portion, and the PDS of the relevant filter portion, respectively. In FIGS. 9A to 9C, symbols S3 and S4 indicate curves of S wave components, respectively and symbols P3 and P4 indicate curves of P wave components, respectively. The maximum reflectance is minimized in the above-described wavelength region to be −19.7 dB.

Figure 10A:
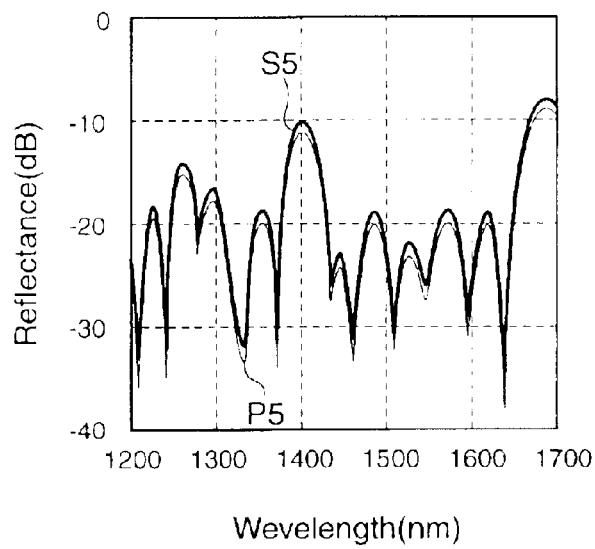
FIGS. 10A to 10C are a characteristic diagram showing reflectivity of a filter portion under condition C4, a characteristic diagram showing PDL of the relevant filter portion, and a characteristic diagram showing PDS of the relevant filter portion, respectively.
Figure 10B:
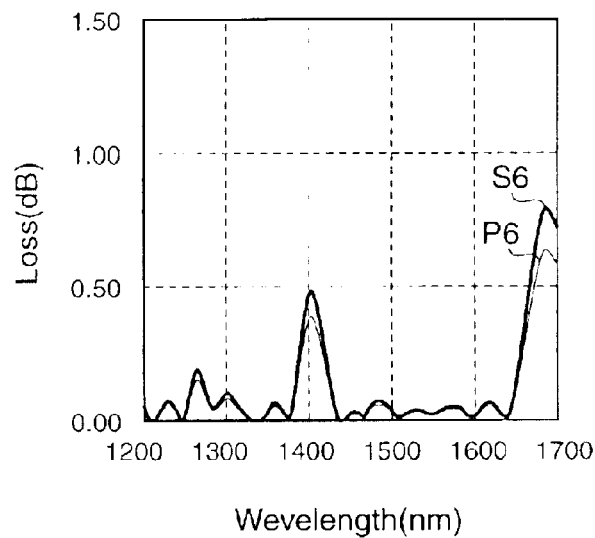
Figure 10C:
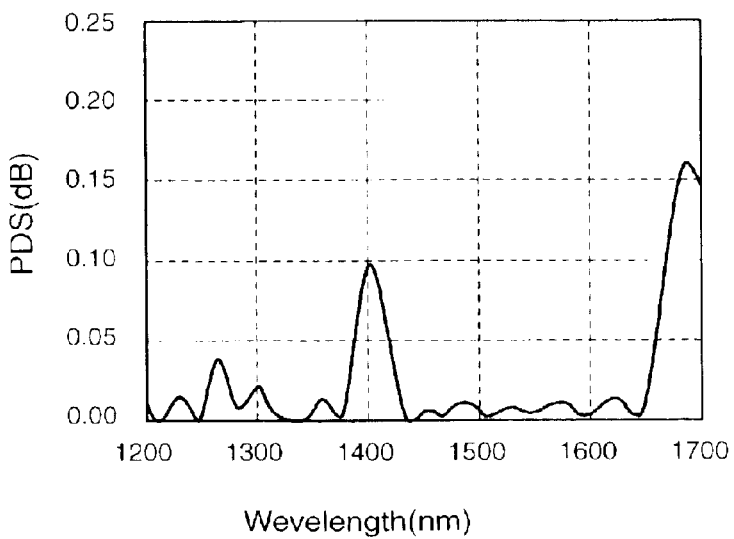

In the condition C5, the thickness of each InP semiconductor layer is 0.2 μm, and the thickness values of InGaAsP semiconductor layers are varied. FIGS. 10A to 10C show the reflectance of the filter portion of the condition C5, the PDL of the relevant filter portion, and the PDS of the relevant filter portion, respectively. In FIGS. 10A to 10C, symbols S5 and S6 indicate curves of S wave components, respectively and symbols P5 and P6 indicate curves of P wave components, respectively. The maximum reflectance is minimized in the above-described wavelength region to be −18.2 dB.

Figure 11A:
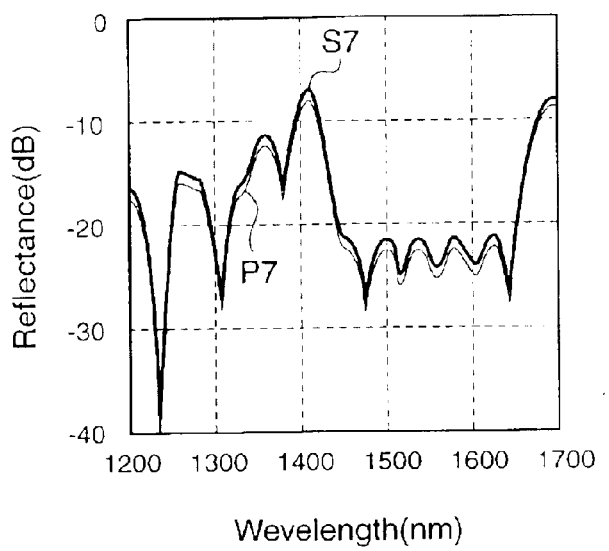
FIGS. 11A to 11C are a characteristic diagram showing reflectivity of a filter portion under condition C5, a characteristic diagram showing PDL of the relevant filter portion, and a characteristic diagram showing PDS of the relevant filter portion, respectively.
Figure 11B:
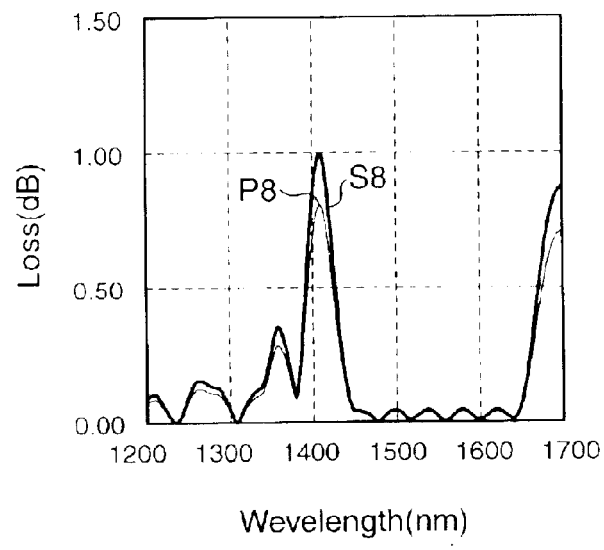
Figure 11C:
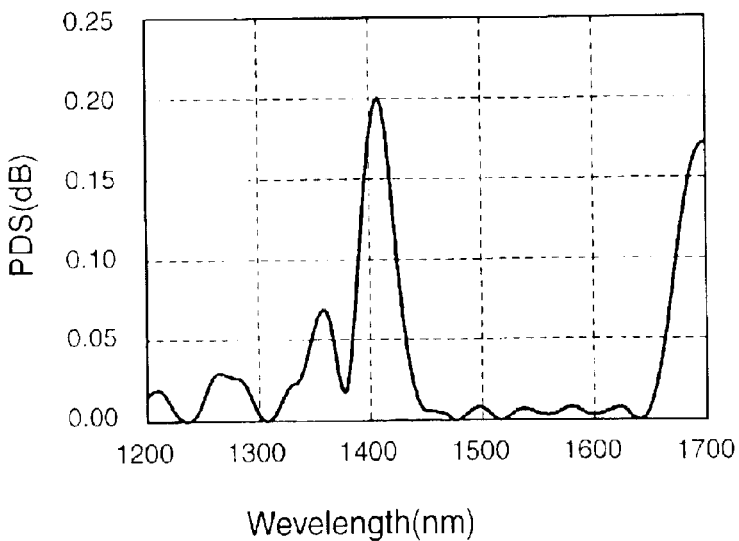

In the condition C6, the thicknesses of InP semiconductor layers can be varied in a range from 0.1 μm to 0.2 μm inclusive, and the thicknesses of InGaAsP semiconductor layers are varied. FIGS. 11A to 11C show the reflectance of the filter portion of the condition C6, the PDL of the relevant filter portion, and the PDS of the relevant filter portion, respectively. In FIGS. 11A to 11C, symbols S7 and S8 indicate curves of S wave components, respectively and symbols P7 and P8 indicate curves of P wave components, respectively. The maximum reflectance is minimized in the above-described wavelength region to be −21.1 dB.

In the condition C0, the thickness of each InP semiconductor layer is 0.5 μm, and the thickness of each InGaAsP semiconductor layer is 1.0 μm. The maximum reflectance is minimized in the above-described wavelength region to be −9.7 dB.

As can be seen from the comparison of the above-described maximum reflectance values, the maximum reflectance of the filter portion with N=5 can be made smaller than that of the filter portion with N=4 in a wavelength range from 1.45 μm to 1.65 μm inclusive. Specifically, it is preferable that N be equal to or more than 5.

Moreover, as can be seen from the comparison of the filter portion of the condition C0 with those of the conditions C1 to C6, it is preferable in minimizing the maximum reflectance in the above-described wavelength range to determine the thickness values of semiconductor layers constituting a filter portion such that these semiconductor layers does not cause optical interference.

Furthermore, as can be seen from the comparison of the conditions C3 to C5, it is preferable in minimizing the maximum reflectance in the above-described wavelength range to reduce the thickness values of InP semiconductor layers constituting a filter portion.

In addition, as can be seen from the comparison of the filer portion of the condition C6 and those of the conditions C3 to C5 with each other, it is more preferable in minimizing the maximum reflectance in the above-described wavelength range to vary the thickness values of InP semiconductor layers constituting a filter portion than to set the thickness to a single value.

Figure 12A:
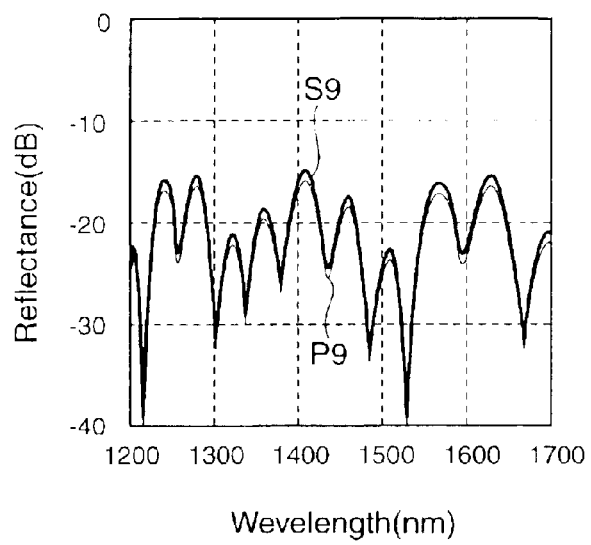
FIGS. 12A to 12C are a characteristic diagram showing reflectivity of a light receiving element, a characteristic diagram showing PDL of the relevant light receiving element, and a characteristic diagram showing PDS of the relevant light receiving element, respectively.
Figure 12B:
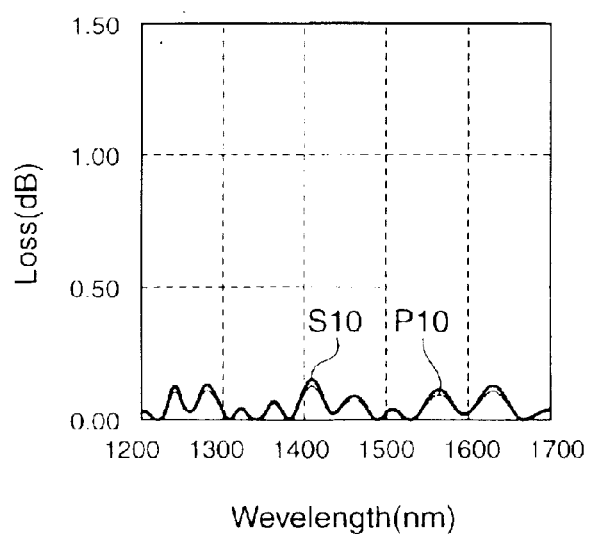
Figure 12C:
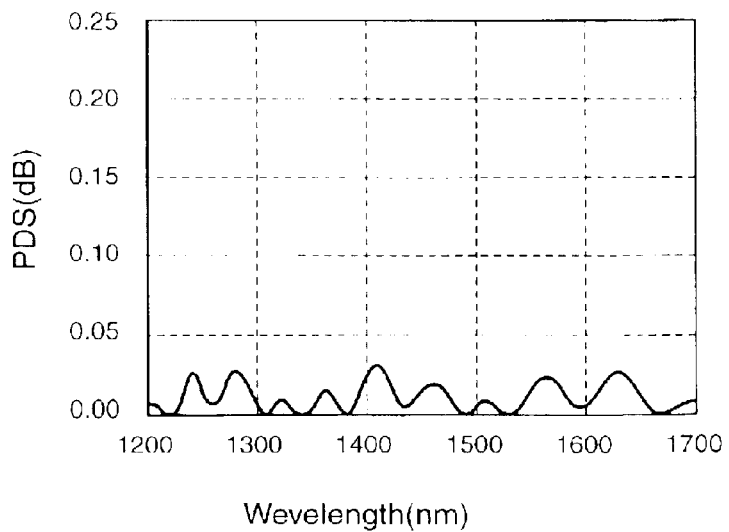

FIGS. 12A to 12C show the reflectance of a light receiving element, the PDL of the relevant light receiving element, and the PDS of the relevant light receiving element, respectively. In FIGS. 12A to 12C, symbols S9 and S10 indicate curves of S wave components, respectively and symbols P9 and P10 indicate curves of P wave components, respectively.

As can be seen from the foregoing description, a filter portion needs to be constituted so as to sufficiently absorb light in the 1.3 μm band. In order to obtain such a filter portion, an InGaAsP semiconductor film having a thickness of about 5 μm needs to be grown while being lattice-matched with the InP semiconductors. However, the epitaxial growth of InGaAsP semiconductor (λg=1.4 to 1.44 μm) requires very sophisticated control technique because of immiscibility gap in the phase diagram of InGaAsP semiconductor.

Phase separation is apt to occur in the immiscibility gap region regardless of crystal growth method (OMVPE, VPE, or LPE).

Meanwhile, in the light receiving elements described in the present embodiments, the total thickness of InGaAsP semiconductor layers has no upper limit. Therefore, a filter portion from these InGaAsP semiconductor layers realizes a sufficient light absorption. Moreover, the thickness of each InGaAsP semiconductor layer can be reduced, thus making crystal growth easy. Specifically, in $Ga_XIn_{1-X}As_YP_{1-Y}$ semiconductor, the condition lattice-matching with the InP semiconductors is $Y=0.42X/(0.18+0.02X)$. However, in forming actual films, a growth condition cannot always be controlled to strictly satisfy the lattice matching condition. If a thin semiconductor film in thickness is grown, this semiconductor film exhibits good crystal quality in relatively greater lattice constant difference. Therefore, in $Ga_XIn_{1-X}As_YP_{1-Y}$ semiconductor, it is possible to enlarge a range of a stoichiometric composition in which a crystal can be grown without phase separation. The possibility of the occurrence of phase separation is sufficiently small if the thickness of an InGaAsP semiconductor film is 1.5 μm or less.

In addition, semiconductor layers in a filter portion have respective values in thickness provided so that the arrangement of the semiconductor layers does not cause any optical interference due to their periodicity in a predetermined wavelength region. Therefore, the loss of transmitted light due to optical interference in a filter portion can be decreased.

(Fifth Embodiment)

Figure 13:
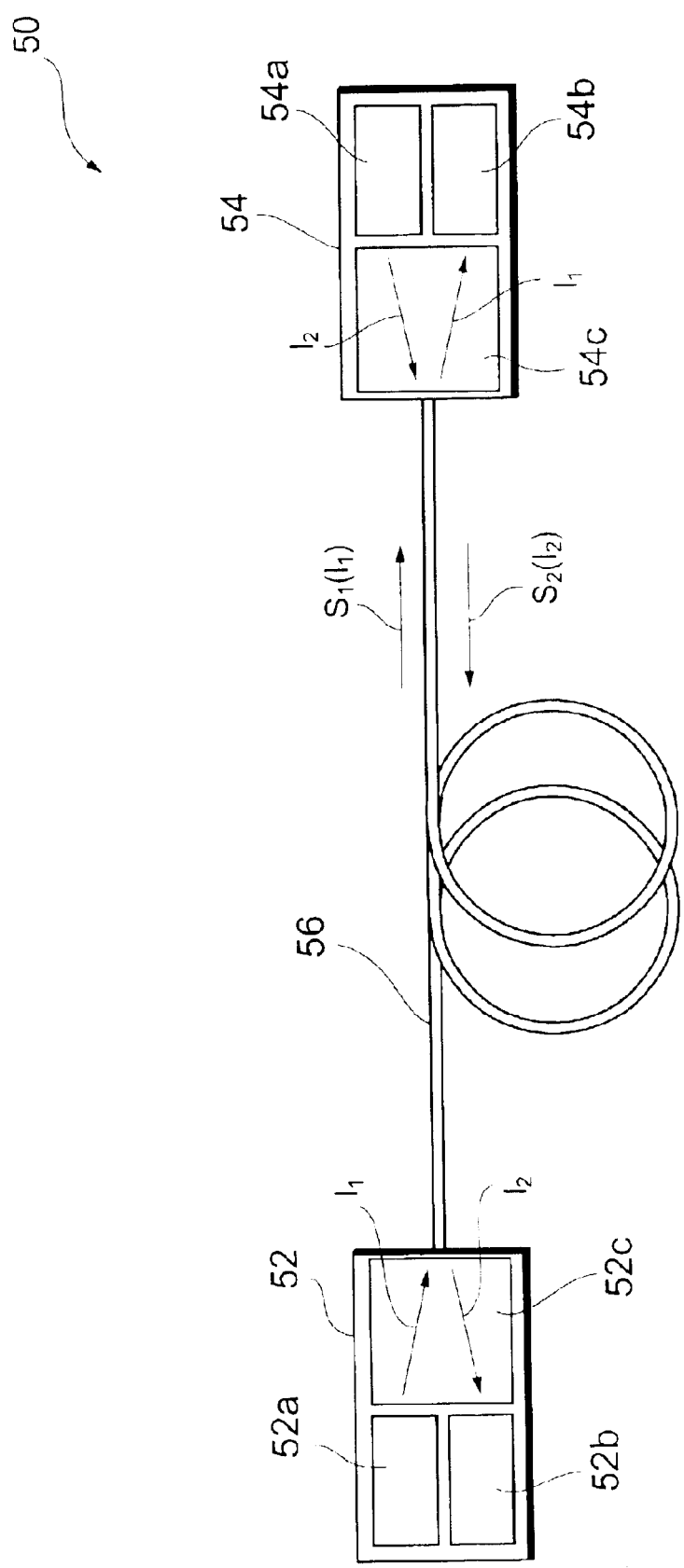
FIG. 13 is a schematic diagram showing an embodiment of an optical communication system.

FIG. 13 is a schematic view showing an optical communication system. The optical communication system 50 has a light transmitting and receiving module 52, a light transmitting and receiving module 54, and an optical communication line 56 optically coupling the light transmitting and receiving modules 52 and 54 to each other. The light transmitting and receiving module 52 can generate an optical signal having a first wavelength component $\lambda_1$ in a wavelength band, such as the 1.55 μm band, in response to an electric signal, and can receive an optical signal having a second wavelength component $\lambda_2$ in a wavelength band, such as the 1.3 μm band, to generate an electric signal in response thereto. The light transmitting and receiving module 54 can generate an optical signal having the second wavelength component $\lambda_2$ in a wavelength band, such as the 1.3 μm band, in response to an electric signal, and can receive an optical signal having the first wavelength component $\lambda_1$ in a wavelength band, such as the 1.55 μm band, to generate an electric signal in response thereto. The light transmitting and receiving modules 52 and 54 are connected with each other through the optical communication line 56, such as an optical fiber. In the optical communication line 56, an optical signal $S_1$ having the first wavelength component $\lambda_1$ propagates from the light transmitting and receiving module 52 toward the light transmitting and receiving module 54, and an optical signal $S_2$ having the second wavelength component $\lambda_2$ propagates from the light transmitting and receiving module 54 toward the light transmitting and receiving module 52.

In the exemplified system, the light transmitting and receiving module 52 includes a light receiving portion exhibiting sensitivity to the 1.3 μm band and no sensitivity to the 1.55 μm band. The light transmitting and receiving module 52 has a semiconductor light emitting element 52a such as a semiconductor laser element, a semiconductor light receiving element 52b such as a photodiode, and an optical multiplexer/demultiplexer 52c which optically couples the semiconductor light emitting element 52a and the semiconductor light receiving element 52b to the optical transmission line. The light transmitting and receiving module 54 includes a light receiving portion having good sensitivity to the 1.55 μm band and less sensitivity to the 1.3 μm band. The light transmitting and receiving module 54 has a semiconductor light emitting element 54a such as a semiconductor laser element, a semiconductor light receiving element 54b such as a photodiode, and an optical multiplexer/demultiplexer 54c which optically couples the semiconductor light emitting element 54a and the semiconductor light receiving element 54b to the optical transmission line. The semiconductor light emitting element 54a generates light of a wavelength component in the 1.3 μm band. The semiconductor light receiving element 54b has a filter portion for absorbing a wavelength component in the 1.3 μm band and has a light absorbing portion responding to a wavelength component in the 1.55 μm band. As the semiconductor light receiving element 54b can include any one of the semiconductor light receiving elements described in the above embodiments.

Although the principle of the present invention has been described and illustrated in the preferred embodiments, a person skilled in the art will recognize that the present invention can be changed in arrangement and detail without departing from such principles. For example, the configuration of a light transmitting and receiving module can be changed as required. Moreover, a buffer layer may be provided between the semiconductor layers and the substrate in the filter portion. We therefore claim all modifications and variations coming within the spirit and the scope of the following claims.

What is claimed is:

1. A semiconductor light receiving element, comprising:
   a light incident face;
   a light detecting portion having a light absorbing layer; and
   a first filter portion provided between the light incident face and the light detecting portion,
   the first filter portion having a plurality of III-V semiconductor layers and a plurality of InGaAsP semiconductor layers, the plurality of III-V semiconductor layers and the plurality of InGaAsP semiconductor layers being provided alternately in a direction of a predetermined axis, and
   band gap of III-V semiconductor material of the III-V semiconductor layers being larger than that of the InGaAsP semiconductor layers and thickness values of the respective InGaAsP semiconductor layers differ from each other.

2. The semiconductor light receiving element according to claim 1, further comprising:
   a substrate provided between the light incident face and the light detecting portion, the substrate being capable of transmitting incident light,
   wherein the first filter portion is provided between the substrate and the light incident face.

3. The semiconductor light receiving element according to claim 1, further comprising:
a substrate provided between the light incident face and the light detecting portion, the substrate being capable of transmitting incident light,
wherein the first filter portion is provided between the light detecting portion and the substrate.

4. The semiconductor light receiving element according to claim 1, further comprising
a substrate provided between the light incident face and the light detecting portion, the substrate being capable of transmitting incident light; and
a second filter portion,
wherein the second filter portion has a plurality of III-V semiconductor layers and a plurality of InGaAsP semiconductor layers, the plurality of III-V semiconductor layers and the plurality of InGaAsP semiconductor layers being provided alternately in a direction of the predetermined axis, and
wherein the substrate is provided between the first and second filter portions.

5. The semiconductor light receiving element according to claim 4,
wherein a thickness of each InGaAsP semiconductor layer in the first filter portion is 1.5 micrometers or less.

6. The semiconductor light receiving element according to claim 5,
wherein a thickness of each InGaAsP semiconductor layer in the second filter portion is 1.5 micrometers or less.

7. The semiconductor light receiving element according to claim 4,
wherein the number of the InGaAsP semiconductor layers and the III-V semiconductor layers in the second filter portion is ten or more.

8. The semiconductor light receiving element according to claim 7,
wherein the number of the InGaAsP semiconductor layer and the III-V semiconductor layer in the first filter portion is ten or more.

9. The semiconductor light receiving element according to claim 4,
wherein each III-V semiconductor layer in the first and second filter portions includes an InP semiconductor layer.

10. The semiconductor light receiving element according to claim 4,
wherein thickness values of the respective InGaAsP semiconductor layers in the
second filter portion differs from each other.

11. The semiconductor light receiving element according to claim 4,
wherein each III-V semiconductor layer in the first and second filter portions includes an InP semiconductor, layer, and
thickness values of the InP semiconductor layers in the first and second filter portions are smaller than those of the InGaAsP semiconductor layers in the first and second filter portions.

12. The semiconductor light receiving element according to claim 4,
wherein each III-V semiconductor layer in the first and second filter portions includes an InP semiconductor, layer, and
wherein the InP semiconductor layers and the InGaAsP semiconductor layers in the first and second filter portions have respective thickness values provided such that each filter portion exhibits transmission spectrum having alight transmission window in a wavelength range from 1.45 micrometers to 1.65 micrometers.

13. The semiconductor light receiving element according to claim 1,
wherein a thickness of each InGaAsP semiconductor layer is 1.5 micrometers or less.

14. The semiconductor light receiving element according to claim 1,
wherein the number of the InGaAsP semiconductor layers and the III-V semiconductor layers is ten or more.

15. The semiconductor light receiving element according to claim 1,
wherein each III-V semiconductor layer in the first filter portion includes an InP semiconductor layer.

16. The semiconductor light receiving element according to claim 1,
wherein each III-V semiconductor layer in the first filter portion includes an InP semiconductor layer, and
wherein thickness values of the InP semiconductor layers are smaller than those of the InGaAsP semiconductor layers.

17. The semiconductor light receiving element according to claim 1,
wherein each III-v semiconductor layer in the first filter portion includes an InP semiconductor layer, and
wherein the InP semiconductor layers and the InGaAsP semiconductor layers in the first filter portion have respective thickness values provided such that the first filter portion exhibits transmission spectrum having a light transmission window in a wavelength range from 1.45 micrometers to 1.65 micrometers.

18. The semiconductor light receiving element according to claim 1, wherein the substrate is an InP substrate.

19. The semiconductor light receiving element according to claim 1, wherein the light absorbing layer is a InGaAs layer, the InGaAs layer being sandwiched between InP layers.

* * * * *